(12) United States Patent
Bhattacharyya

(10) Patent No.: US 6,908,798 B1
(45) Date of Patent: Jun. 21, 2005

(54) METHODS OF MAKING SEMICONDUCTOR-ON-INSULATOR THIN FILM TRANSISTOR CONSTRUCTIONS

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 68 days.

(21) Appl. No.: 10/625,068

(22) Filed: Jul. 22, 2003

Related U.S. Application Data

(62) Division of application No. 10/243,180, filed on Sep. 12, 2002, now Pat. No. 6,759,712.

(51) Int. Cl.$^7$ .............................................. H01L 21/00
(52) U.S. Cl. ............................... 438/166; 438/164.933; 257/347
(58) Field of Search ................................ 257/347, 616; 438/164, 166, 933

(56) References Cited

U.S. PATENT DOCUMENTS

| | | | | |
|---|---|---|---|---|
| 6,054,730 | A | * | 4/2000 | Noguchi ..................... 257/306 |
| 6,204,608 | B1 | | 3/2001 | Song et al. .............. 315/169.3 |
| 6,593,624 | B2 | | 7/2003 | Walker ........................ 257/344 |
| 6,724,008 | B2 | * | 4/2004 | Fitzergald .................... 257/19 |
| 6,730,551 | B2 | * | 5/2004 | Lee et al. ................... 438/191 |
| 6,759,712 | B2 | * | 7/2004 | Bhattacharyya ............. 257/347 |
| 2002/0014625 | A1 | | 2/2002 | Asami et al. .................. 257/57 |
| 2002/0045312 | A1 | | 4/2002 | Zheng et al. ................ 438/253 |
| 2003/0013305 | A1 | | 1/2003 | Sugi et al. .................. 438/689 |

OTHER PUBLICATIONS

Ono, K. et al., "Analysis of Current–Voltage Characteristics in Polysilicon TFTs for LCDs", IEDM Tech. Digest, 1988, pp. 256–259.

Yamauchi, N. et al., "Drastically Improved Performance in Poly–Si TFTs with Channel Dimensions Comparable to Grain Size", IEDM Tech. Digest, 1989, pp. 353–356.

King, T. et al, "A Low–Temperature ($\leq 550°C$) Silicon–Germanium MOS Thin–Film Transistor Technology for Large–Area Electronics", IEDM Tech. Digest, 1991, pp. 567–570.

Kuriyama, H. et al., "High Mobility Poly–Si TFT by a New Excimer Laser Annealing Method for Large Area Electronics", IEDM Tech. Digest, 1991. pp. 563–566.

Jeon, J. et al., "A New Poly–Si TFT with Selectively Doped Channel Fabricated by Novel Excimer Laser Annealing", IEDM Tech. Digest, 2000, pp. 213–216.

Kim, C.H. et al., "A New High –Performance Poly3–Si TFT by Simple Excimer Laser Annealing on Selectively Floating a–Si Layer", IEDM Tech. Digest, 2001, pp. 751–754.

(Continued)

*Primary Examiner*—Christian Wilson
(74) *Attorney, Agent, or Firm*—Wells St. John P.S.

(57) ABSTRACT

The invention includes SOI thin film transistor constructions, memory devices, computer systems, and methods of forming various structures, devices and systems. The structures typically comprise a thin crystalline layer of silicon/germanium formed over a wide range of suitable substrates. The crystalline properties of the silicon/germanium can be controlled during formation of the silicon/germanium so that the material has a relaxed crystalline lattice and large crystalline grain sizes. The crystalline grain sizes can be sufficiently large so that transistor devices formed in association with the thin crystalline material have active regions utilizing only a single grain of the silicon/germanium material. The silicon/germanium material having a relaxed crystalline lattice can be utilized alone in forming channel regions of transistor devices, or alternatively a semiconductor material having a strained crystalline lattice can be provided between the relaxed crystalline lattice and gates of the transistor devices.

29 Claims, 5 Drawing Sheets

OTHER PUBLICATIONS

Hara, A. et al, "Selective Single–Crystalline–Silicon Growth at the Pre–Defined Active Regions of TFTs on a Glass by a Scanning CW Layer Irradiation", IEDM Tech. Digest, 2000, pp. 209–212.

Hara, A. et al., "High Performance Poly–Si TFTs on a Glass by a Stable Scanning CW Laser Lateral Crystallization", IEDM Tech. Digest, 2001, pp. 747–750.

Jagar, S. et al., "Single Grain Thin–Film–Transistor (TFT) with SOI CMOS Performance Formed by Metal–Induced–Lateral–Crystallization", IEMD Tech. Digest, 1999, p. 293–296.

Gu, J. et al., "High Performance Sub–100 nm Si Thin–Film Transistors by Pattern–Controlled Crystallization of Thin Channel Layer and High Temperature Annealing", DRC Conference Digest, 2002, pp. 49–50.

Kesan, V. et al., "High Performance 0.25$\mu$m p–MOSFETs with Silicon—Germanium Channels for 300K and 77K Operation", IEDM Tech. Digest, 1991, pp. 25–28.

Garone, P.M. et al., "Mobility Enhancement and Quantum Mechanical Modeling In $Ge_xSi_{1-x}$ Channel MOSFETs from 90 to 300K", IEDM Tech. Digest, 1991, pp. 29–32.

Feder, B.J., "I.B.M. Finds Way to Speed Up Chips", The New York Times, Jun. 8, 2001, reprinted from http://www.nytimes.com/2001/06/08 /technology/08BLUE.html. 2 pgs.

Rim, K. et al., "Strained Si NMOSFET's for High Performance CMOS Technology", 2001 Sympos. on VLSI Tech. Digest of Technical Papers, p. 59–60.

Li, P. et al., "Design of High Speed Si/SiGe Heterojunction Complementary MOSFETs with Reduced Short–Channel Effects", Natl. Central University, ChungLi, Taiwan, ROC, Aug. 2001, Contract No. NSC 89–2215–E–008–049, National Science Council of Taiwan., pp. 1, 9.

Ernst, T. et al., "Fabrication of a Novel Strained SiGe:C–channel Planar 55 nm nMOSFET for High–Performance CMOS", 2002 Sympos. on VLSI Tech. Digest of Technical Papers, pp. 92–93.

Rim, K. et al., "Characteristics and Device Design of Sub–100 nm Strained Sin–and PMOSFETs", 2002 Sympos. on VLSI Tech. Digest of Technical Papers, pp. 98–99.

Belford, R.E. et al., "Performance–Augmented CMOS Using Back–End Uniaxial Strain", DRC Conf. Digest, 2002, pp. 41–42.

Shima, M. et al., "<100> Channel Strained–SIGe p–MOSFET with Enhanced Hole Mobility and Lower Parasitic Resistance", 2002 Sympos. on VLSI Tech. Digest of Technical Papers, pp. 94–95.

Nayfeh, H.M. et al., "Electron Inversion Layer Mobility in Strained–Si n–MOSFET's with High Channel Doping Concentration Achieved by Ion Implantation", DRC Conf. Digest, 2002, pp. 43–44.

Bae, G.J. et al., "A Novel SIGe–Inserted SOI Structure for High Performance PDSOI CMOSFET", IEDM Tech. Digest, 2000, pp. 667–670.

Cheng, Z. et al., "SiGe–on–Insulator (SGOI): Substrate Preparation and MOSFET Fabrication for Electron Mobility Evaluation" and conference outline, MIT Microsystems, Tech. Labs, Cambridge, MA, 2001 IEEE Internatol. SOI Conf., Oct. 1, pp. 13–14m 3–pg. outline.

Huang, L.J. et al., "Carrier Mobility Enhancement in Strained Si–on–Insulator Fabricated by Wafer Bonding", 2001 Sympos. on VLSI Tech. Digest of Technical Papers, pp. 57–58.

Mizuno, T. et al., "High Performance CMOS Operation of Strained–SOI MOSFETs Using Thin Film SiGe–on–Insulator Substrate", 2002 Sympos. on VLSI Tech. Digest of Technical Papers, p. 106–107.

Tezuka, T. et al., "High–Performance Strained SI–on–Insulator MOSFETs by Novel Fabricaton Processes Utilizing Ge–Condensation Technique", 2002 VLSI Tech. Digest of Technical Papers, pp. 96–97.

Takagi, S., "Strained–Si–and SiGe–on–Insulator (Strained SOI and SGOI) MOSFETs for High Performance/Low Power CMOS Application", DRC Conf. Digest, 2002, pp. 37–40.

"IBM Builds World's Fastest Communications Microchip", Reuters U.S. Company News, Feb. 25, 2002, reprinted from http://activequote300.fidelity.com/rtrnews/$_{13}$ individual$_{13}$n . . . / . . . 1 pg.

Markoff, J., "I.B.M. Circuits are Now Faster and Reduce Use of Power", The New York Times, Feb. 25, 2002, reprinted Mar. 20, 2002 from http://story.news.yahoo.com/news?tmpl=story&u=/nyt/20020223/ . . . , 1 pg.

Park, J.S. et al., "Normal Incident SiGe/Si Multiple Quantum Well Infrared Detector", IEDM Tech. Digest, 1991, pp. 749–752.

Current, M.I. et al., "Atomic–Layer Cleaving with $Si_xGe_y$, Strain Layers for Fabrication of Si and Ge–Rich SOI Device Layers", 2001 IEEE Internatl. SOI Conf. Oct. 1, pp. 11–12.

Bhattacharyya, A., "The Role of Microelectronic Integration in Environmental Control: A Perspective", Mat. Res. Soc. Symp. Proc. vol. 344, 1994, pp. 281–293.

Myers, S.M. et al., "Deuterium Interactions in Oxygen–Implanted Copper", J. Appl. Phys., vol. 65(1), Jan. 1, 1989, p. 311–321.

Saggio, M. et al., "Innovative Localized Lifetime Control in High–Speed IGBT's", IEEE Elec. Dev. Lett., V. 18, No. 7, Jul. 1997, pp. 333–335.

Lu, N.C.C. et al., "A Buried–Trench DRAM Cell Using a Self–Aligned Epitaxy Over Trench Technology", IEDM Tech. Digest, 1988, pp. 588–591.

Yamada, T. et al., "Spread Source/Drain (SSD) MOSFET Using Selective Silicon Growth for 64Mbit DRAMs", IEDM Tech. Digest, 1989, pp. 35–38.

van Meer, H. et al., "Ultra–Thin Film Fully–Depleted SOI CMOS with Raised G/S/D Device Architecture for Sub–100 nm Applications", 2001 IEEE Internatl. SOI Conf. Oct. 1, pp. 45–46.

* cited by examiner

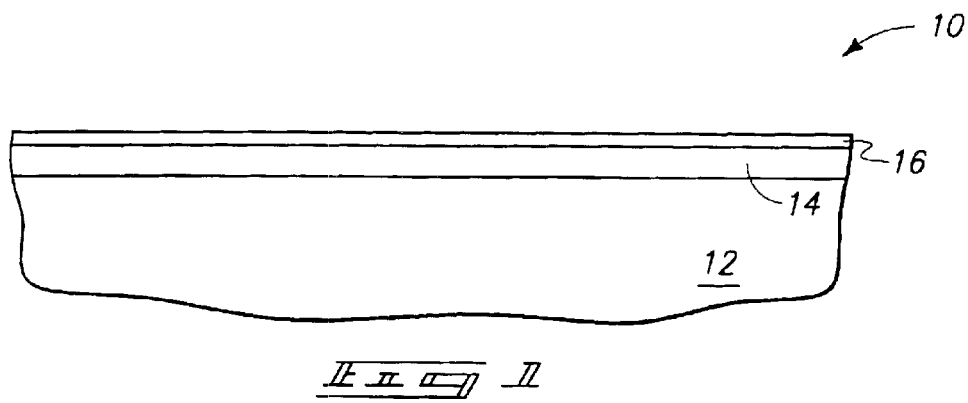
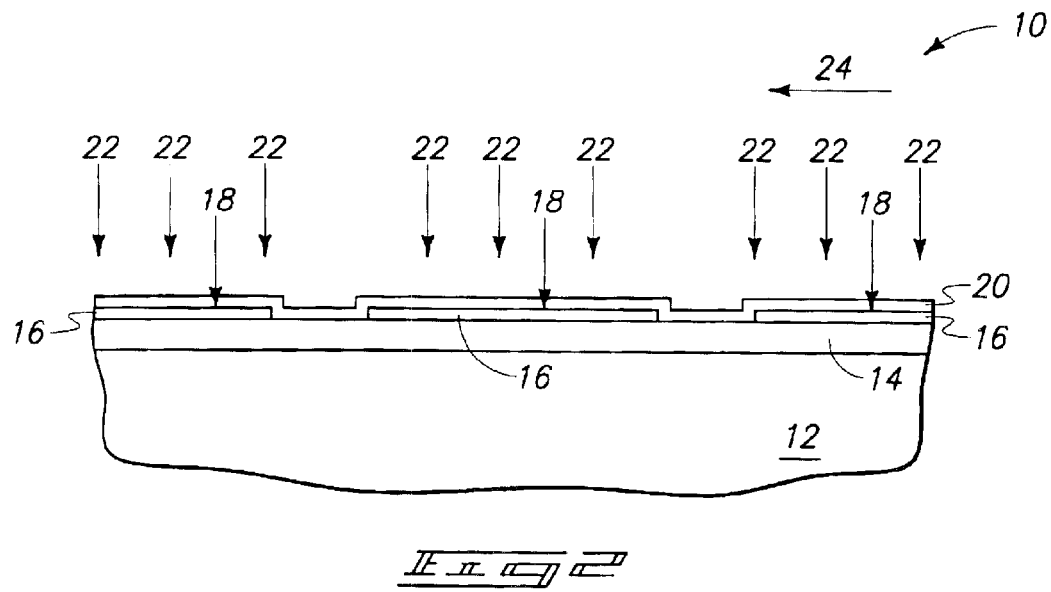
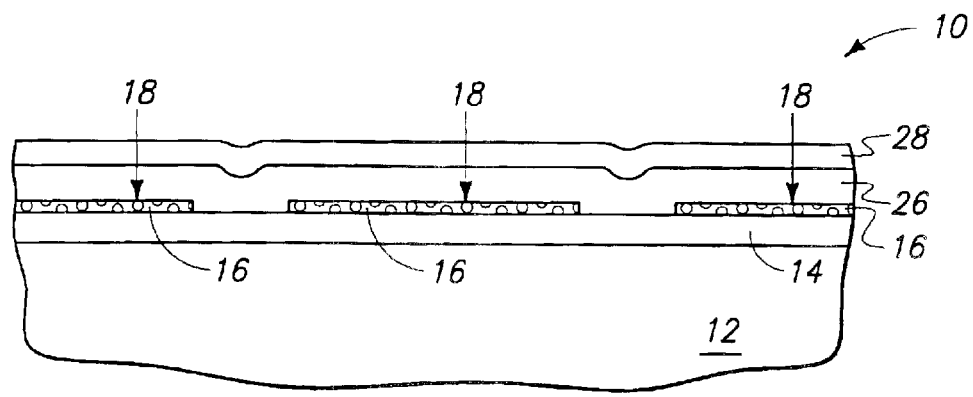

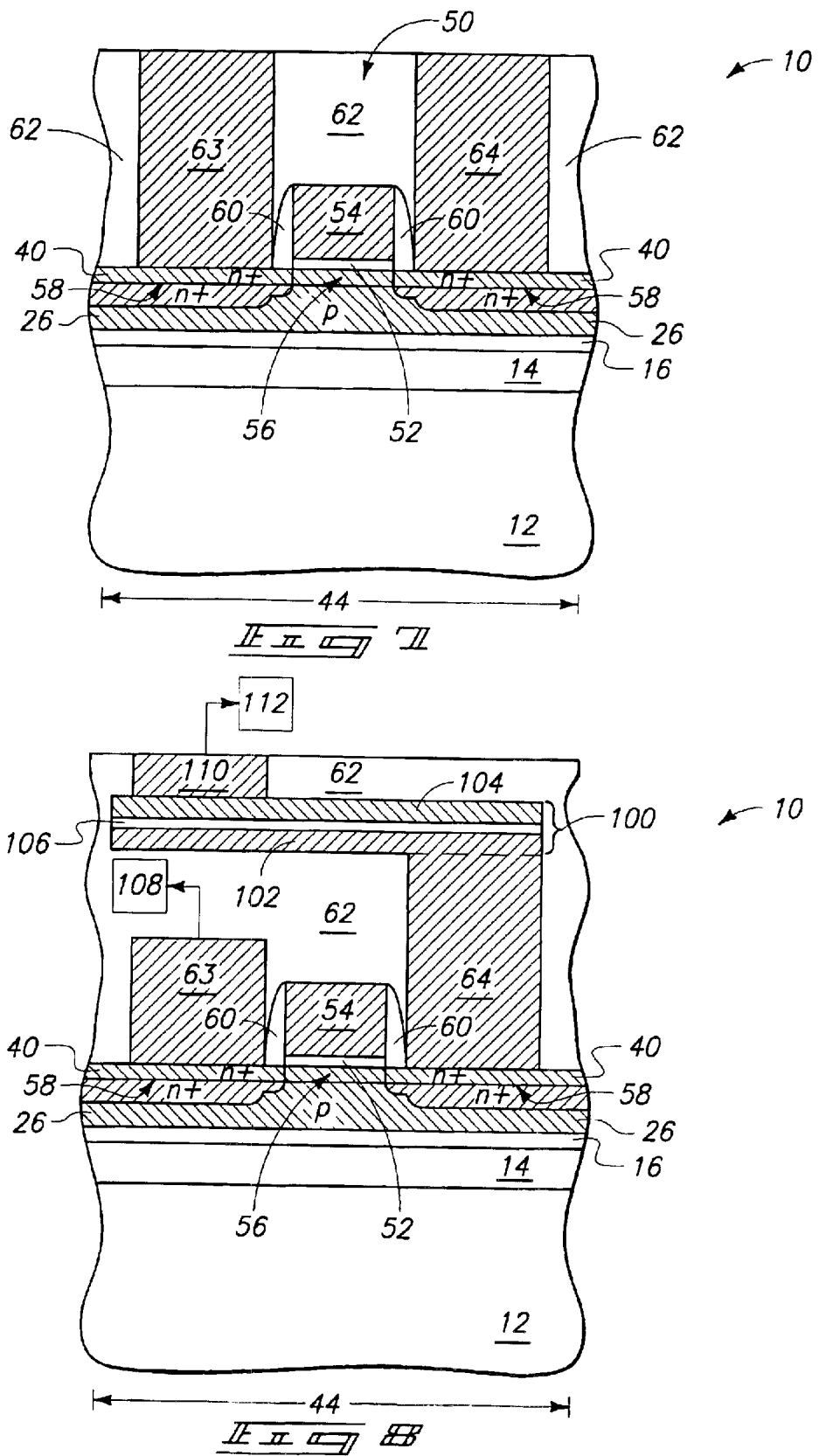

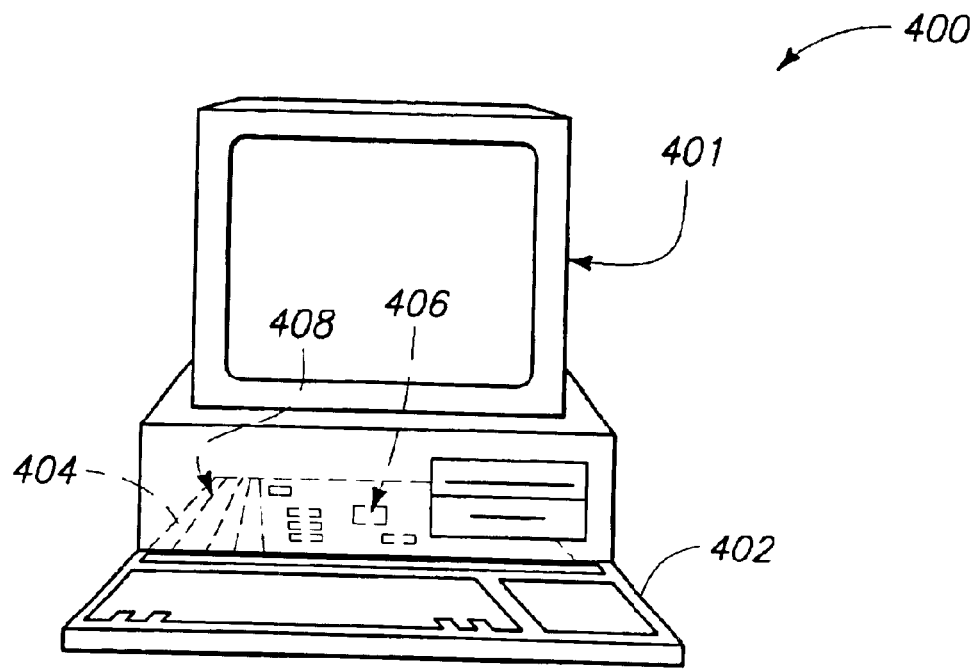
Fig. III
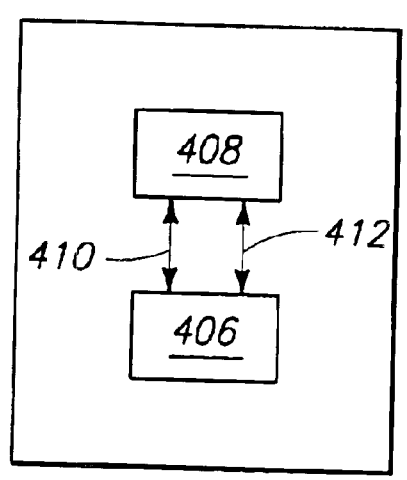
Fig. IV

METHODS OF MAKING SEMICONDUCTOR-ON-INSULATOR THIN FILM TRANSISTOR CONSTRUCTIONS

RELATED PATENT DATA

This is a divisional of U.S. patent application Ser. No. 10/243,180, which was filed Sep. 12, 2002, now U.S. Pat. No. 6,759,712.

TECHNICAL FIELD

The invention pertains to semiconductor-on-insulator (SOI) constructions, and methods of making SOI constructions. In exemplary aspects the invention pertains to memory devices, such as, for example, dynamic random access memory (DRAM), and computer systems utilizing memory devices.

BACKGROUND OF THE INVENTION

SOI technology differs from traditional bulk semiconductor technologies in that the semiconductor material of SOI technologies is typically much thinner than that utilized in bulk technologies. The semiconductor material of SOI technologies will typically be formed as a thin film over an insulating material (typically oxide), with exemplary thicknesses of the semiconductor film being less than or equal to 2000 Å. In contrast, bulk semiconductor material will typically have a thickness of at least about 200 microns. The thin semiconductor of SOI technology can allow higher performance and lower power consumption to be achieved in integrated circuits than can be achieved with similar circuits utilizing bulk materials.

An exemplary integrated circuit device that can be formed utilizing SOI technologies is a so-called thin film transistor (TFT), with the term "thin film" referring to the thin semiconductor film of the SOI construction. In particular aspects, the semiconductor material of the SOI construction can be silicon, and in such aspects the TFTs can be fabricated using recrystallized amorphous silicon or polycrystalline silicon. The silicon can be supported by an electrically insulative material (such as silicon dioxide), which in turn is supported by an appropriate substrate. Exemplary substrate materials include glass, bulk silicon and metal-oxides (such as, for example, $Al_2O_3$). If the semiconductor material comprises silicon, the term SOI is occasionally utilized to refer to a silicon-on-insulator construction, rather than the more general concept of a semiconductor-insulator construction. However, it is to be understood that in the context of this disclosure the term SOI refers to semiconductor-on-insulator constructions. Accordingly, the semiconductor material of an SOI construction referred to in the context of this disclosure can comprise other semiconductive materials in addition to, or alternatively to, silicon; including, for example, germanium.

A problem associated with conventional TFT constructions is that grain boundaries and defects can limit carrier mobilities. Accordingly, carrier mobilities are frequently nearly an order of magnitude lower than they would be in bulk semiconductor devices. High voltage (and therefore high power consumption), and large areas are utilized for the TFTs, and the TFTs exhibit limited performance. TFTs have thus had limited commercial application and currently are utilized primarily for large area electronics.

Various efforts have been made to improve carrier mobility of TFTs. Some improvement is obtained for devices in which silicon is the semiconductor material by utilizing a thermal anneal for grain growth following silicon ion implantation and hydrogen passivation of grain boundaries (see, for example, Yamauchi, N. et al., "Drastically Improved Performance in Poly-Si TFTs with Channel Dimensions Comparable to Grain Size", IEDM Tech. Digest, 1989, pp. 353–356). Improvements have also been made in devices in which a combination of silicon and germanium is the semiconductor material by optimizing the germanium and hydrogen content of silicon/germanium films (see, for example, King, T. J. et al, "A Low-Temperature (<=550° C.) Silicon-Germanium MOS TFT Technology for Large-Area Electronics", IEDM Tech. Digest, 1991, pp. 567–570).

Investigations have shown that nucleation, direction of solidification, and grain growth of silicon crystals can be controlled selectively and preferentially by excimer laser annealing, as well as by lateral scanning continuous wave laser irradiation/anneal for recrystallization (see, for example, Kuriyama, H. et al., "High Mobility Poly-Si TFT by a New Excimer Laser Annealing Method for Large Area Electronics", IEDM Tech. Digest, 1991, pp. 563–566; Jeon, J. H. et al., "A New Poly-Si TFT with Selectively Doped Channel Fabricated by Novel Excimer Laser Annealing", IEDM Tech. Digest, 2000, pp. 213–216; Kim, C. H. et al., "A New High -Performance Poly-Si TFT by Simple Excimer Laser Annealing on Selectively Floating a Si Layer", IEDM Tech. Digest, 2001, pp. 753–756; Hara, A. et al, "Selective Single-Crystalline-Silicon Growth at the Pre-Defined Active Regions of TFTs on a Glass by a Scanning CW Layer Irradiation", IEDM Tech. Digest, 2000, pp. 209–212; and Hara, A. et al., "High Performance Poly-Si TFTs on a Glass by a Stable Scanning CW Laser Lateral Crystallization", IEDM Tech. Digest, 2001, pp. 747–750). Such techniques have allowed relatively defect-free large crystals to be grown, with resulting TFTs shown to exhibit carrier mobility over 300 $cm^2/V*second$.

Another technique which has shown promise for improving carrier mobility is metal-induced lateral recrystallization (MILC), which can be utilized in conjunction with an appropriate high temperature anneal (see, for example, Jagar, S. et al., "Single Grain TFT with SOI CMOS Performance Formed by Metal-Induced-Lateral-Crystallization", IEDM Tech. Digest. 1999, p. 293–296; and Gu, J. et al., "High Performance Sub-100 nm Si TFT by Pattern-Controlled Crystallization of Thin Channel Layer and High Temperature Annealing", DRC Conference Digest, 2002, pp. 49–50). A suitable post-recrystallization anneal for improving the film quality within silicon recrystallized by MILC is accomplished by exposing recrystallized material to a temperature of from about 850° C. to about 900° C. under an inert ambient (with a suitable ambient comprising, for example, $N_2$). MILC can allow nearly single crystal silicon grains to be formed in predefined amorphous-silicon islands for device channel regions. Nickelinduced-lateral-recrystallization can allow device properties to approach those of single crystal silicon.

The carrier mobility of a transistor channel region can be significantly enhanced if the channel region is made of a semiconductor material having a strained crystalline lattice (such as, for example, a silicon/germanium material having a strained lattice, or a silicon material having a strained lattice) formed over a semiconductor material having a relaxed lattice (such as, for example, a silicon/germanium material having a relaxed crystalline lattice). (See, for example, Rim, K. et al., "Strained Si NMOSFETs for High Performance CMOS Technology", VLSI Tech. Digest, 2001, p. 59–60; Cheng, Z. et al., "SiGe-On-Insulator (SGOI)

Substrate Preparation and MOSFET Fabrication for Electron Mobility Evaluation" 2001 IEEE SOI Conference Digest, Oct. 2001, pp. 13–14; Huang, L. J. et al., "Carrier Mobility Enhancement in Strained Si-on-Insulator Fabricated by Wafer Bonding", VLSI Tech. Digest, 2001, pp. 57–58; and Mizuno, T. et al., "High Performance CMOS Operation of Strained-SOI MOSFETs Using Thin Film SiGe-on-Insulator Substrate", VLSI Tech. Digest, 2002, p. 106–107.)

The terms "relaxed crystalline lattice" and "strained crystalline lattice" are utilized to refer to crystalline lattices which are within a defined lattice configuration for the semiconductor material, or perturbed from the defined lattice configuration, respectively. In applications in which the relaxed lattice material comprises silicon/germanium having a germanium concentration of from 10% to 60%, mobility enhancements of 110% for electrons and 60–80% for holes can be accomplished by utilizing a strained lattice material in combination with the relaxed lattice material (see for example, Rim, K. et al., "Characteristics and Device Design of Sub-100 nm Strained SiN and PMOSFETs", VLSI Tech. Digest, 2002, 00. 98–99; and Huang, L. J. et al., "Carrier Mobility Enhancement in Strained Si-on-Insulator Fabricated by Wafer Bonding", VLSI Tech. Digest, 2001, pp. 57–58).

Performance enhancements of standard field effect transistor devices are becoming limited with progressive lithographic scaling in conventional applications. Accordingly, strained-lattice-channeled-field effect transistors on relaxed silicon/germanium offers an opportunity to enhance device performance beyond that achieved through conventional lithographic scaling. IBM recently announced the world's fastest communications chip following the approach of utilizing a strained crystalline lattice over a relaxed crystalline lattice (see, for example, "IBM Builds World's Fastest Communications Microchip", Reuters U.S. Company News, Feb. 25, 2002; and Markoff, J., "IBM Circuits are Now Faster and Reduce Use of Power", The New York Times, Feb. 25, 2002).

Although various techniques have been developed for substantially controlling nucleation and grain growth processes of semiconductor materials, grain orientation control is lacking. Further, the post-anneal treatment utilized in conjunction with MILC can be unsuitable in applications in which a low thermal budget is desired. Among the advantages of the invention described below is that such can allow substantial control of crystal grain orientation within a semiconductor material, while lowering thermal budget requirements relative to conventional methods. Additionally, the quality of the grown crystal formed from a semiconductor material can be improved relative to that of conventional methods.

SUMMARY OF THE INVENTION

The invention includes device configurations in which thin crystalline layers comprising silicon and germanium are incorporated into semiconductor devices. In a particular aspect, the semiconductor device is a transistor device having an active region which extends into the crystalline layer comprising silicon and germanium. The entirety of the active region of the transistor device can be within only a single crystal of the crystalline layer. Further, the crystalline layer comprising silicon and germanium can have a relaxed crystalline lattice, and a semiconductor material having a strained crystalline lattice can be provided between the relaxed crystalline lattice and a gate of the transistor device.

Structures formed in accordance with the present invention can be incorporated into memory devices, and into computer systems. Memory devices formed utilizing structures of the present invention can have enhanced performance characteristics relative to conventional devices. The enhanced performance characteristics can be due to, for example, high mobilities of electrons and holes within the thin semiconductor materials formed in accordance with various aspects of the present invention.

BRIEF DESCRIPTION OF THE DRAWINGS

Preferred embodiments of the invention are described below with reference to the following accompanying drawings.

FIG. 1 is a diagrammatic, cross-sectional view of a fragment of a semiconductor construction shown at a preliminary stage of an exemplary process of the present invention.

FIG. 2 is a view of the FIG. 1 wafer shown at a processing stage subsequent to that of FIG. 1.

FIG. 3 is a view of the FIG. 1 fragment shown at a processing stage subsequent to that of FIG. 2.

FIG. 7 is an expanded region of the FIG. 6 fragment shown at a processing stage subsequent to that of FIG. 6 in accordance with an exemplary embodiment of the present invention.

FIG. 8 is a view of the FIG. 7 fragment shown at a processing stage subsequent to that of FIG. 7.

FIG. 10 is a diagrammatic view of a computer illustrating an exemplary application of the present invention.

FIG. 11 is a block diagram showing particular features of the motherboard of the FIG. 10 computer.

DETAILED DESCRIPTION OF THE PREFERRED EMBODIMENTS

Figure 4:
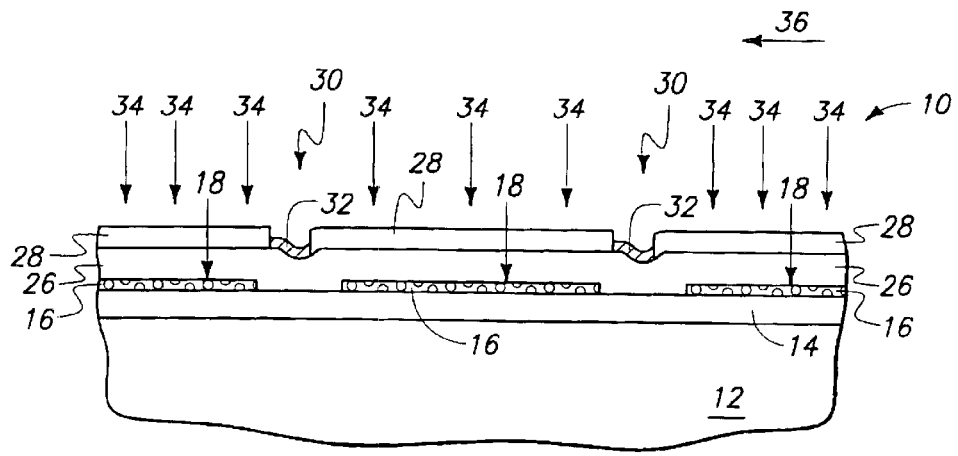
FIG. 4 is a view of the FIG. 1 fragment shown at a processing stage subsequent to that of FIG. 3.

An exemplary method of forming an SOI construction in accordance with an aspect of the present invention is described with reference to FIGS. 1–6.

Referring initially to FIG. 1, a fragment of a semiconductor construction 10 is illustrated at a preliminary processing stage. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Construction 10 comprises a base (or substrate) 12 and an insulator layer 14 over the base. Base 12 can comprise, for example, one or more of glass, aluminum oxide, silicon dioxide, metal and plastic. Additionally, and/or alternatively, base 12 can comprise a semiconductor material, such as, for example, a silicon wafer.

Layer 14 comprises an electrically insulative material, and in particular applications can comprise, consist essentially of, or consist of silicon dioxide. In the shown construction, insulator layer 14 is in physical contact with base 12. It is to be understood, however, that there can be intervening materials and layers provided between base 12 and layer 14 in other aspects of the invention (not shown). For example, a chemically passive thermally stable material, such as silicon nitride ($Si_3N_4$), can be incorporated between base 12 and layer 14. Layer 14 can have a thickness of, for example, from about 200 nanometers to about 500 nanometers, and can be referred to as a buffer layer.

Layer 14 preferably has a planarized upper surface. The planarized upper surface can be formed by, for example, chemical-mechanical polishing.

A layer 16 of semiconductive material is provided over insulator layer 14. In the shown embodiment, semiconductive material layer 16 is formed in physical contact with insulator 14. Layer 16 can have a thickness of, for example, from about 5 nanometers to about 10 nanometers. Layer 16 can, for example, comprise, consist essentially of, or consist of either doped or undoped silicon. If layer 16 comprises, consists essentially of, or consists of doped silicon, the dopant concentration can be from about $10^{14}$ atoms/cm$^3$ to about $10^{20}$ atoms/cm$^3$. The dopant can be either n-type or p-type, or a combination of n-type and p-type.

The silicon utilized in layer 16 can be either polycrystalline silicon or amorphous silicon at the processing stage of FIG. 1. It can be advantageous to utilize amorphous silicon in that it is typically easier to deposit a uniform layer of amorphous silicon than to deposit a uniform layer of polycrystalline silicon.

Referring to FIG. 2, material 16 is patterned into a plurality of discrete islands (or blocks) 18. Such can be accomplished utilizing, for example, photoresist (not shown) and photolithographic processing, together with an appropriate etch of material 16.

A capping layer 20 is provided over islands 18 and over portions of layer 14 exposed between the islands. Layer 20 can, for example, comprise, consist essentially of, or consist of one or both of silicon dioxide and silicon. Layer 20 can also comprise multiple layers of silicon dioxide, stress-free silicon oxynitride, and silicon.

After formation of capping layer 20, small voids (nanovoids) and small crystals are formed in the islands 18. The formation of the voids and crystals can be accomplished by ion implanting helium 22 into material 16 and subsequently exposing material 16 to laser-emitted electromagnetic radiation. The helium can aid in formation of the nanovoids; and the nanovoids can in turn aid in crystallization and stress relief within the material 16 during exposure to the electromagnetic radiation. The helium can thus allow crystallization to occur at lower thermal budgets than can be achieved without the helium implantation. The helium is preferably implanted selectively into islands 18 and not into regions between the islands. The exposure of construction 10 to electromagnetic radiation can comprise subjecting the construction to scanned continuous wave laser irradiation while the construction is held at an appropriate elevated temperature (typically from about 300° C. to about 450° C.). The exposure to the electromagnetic radiation can complete formation of single crystal seeds within islands 18 The laser irradiation is scanned along an axis 24 in the exemplary shown embodiment.

The capping layer 20 discussed previously is optional, but can beneficially assist in retaining helium within islands 18 and/or preventing undesirable impurity contamination during the treatment with the laser irradiation.

Referring to FIG. 3, islands 18 are illustrated after voids have been formed therein. Additionally, small crystals (not shown) have also been formed within islands 18 as discussed above.

Capping layer 20 (FIG. 2) is removed, and subsequently a layer 26 of semiconductive material is formed over islands 18. Layer 26 can comprise, consist essentially of, or consist of silicon and germanium; or alternatively can comprise, consist essentially of, or consist of doped silicon/germanium. The germanium concentration within layer 16 can be, for example, from about 10 atomic percent to about 60 atomic percent. In the shown embodiment, layer 26 physically contacts islands 18, and also physically contacts insulator layer 14 in gaps between the islands. Layer 26 can be formed to a thickness of, for example, from about 50 nanometers to about 100 nanometers, and can be formed utilizing a suitable deposition method, such as, for example, plasma-assisted chemical vapor deposition.

A capping layer 28 is formed over semiconductor layer 26. Capping layer 28 can comprise, for example, silicon dioxide. Alternatively, capping layer 28 can comprise, for example, a combination of silicon dioxide and stress-free silicon oxynitride. Capping layer 28 can protect a surface of layer 26 from particles and contaminants that could otherwise fall on layer 26. If the processing of construction 10 occurs in an environment in which particle formation and/or incorporation of contaminants is unlikely (for example, an ultrahigh vacuum environment), layer 28 can be eliminated from the process. Layer 28 is utilized in the patterning of a metal (discussed below). If layer 28 is eliminated from the process, other methods besides those discussed specifically herein can be utilized for patterning the metal.

Referring to FIG. 4, openings 30 are extended through capping layer 28 and to an upper surface of semiconductive material 26. Openings 30 can be formed by, for example, photolithographic processing to pattern a layer of photoresist (not shown) into a mask, followed by a suitable etch of layer 28 and subsequent removal of the photoresist mask.

A layer 32 of metal-containing material is provided within openings 30, and in physical contact with an upper surface of semiconductive material 26. Layer 32 can have a thickness of, for example, less than or equal to about 10 nanometers. The material of layer 32 can comprise, consist essentially of, or consist of, for example, nickel. Layer 32 can be formed by, for example, physical vapor deposition. Layer 32 can be formed to be within openings 30 and not over material 28 (as is illustrated in FIG. 4) by utilizing deposition conditions which selectively form metal-containing layer 32 on a surface of material 26 relative to a surface of material 28. Alternatively, material 32 can be deposited by a substantially non-selective process to form the material 32 over the surface of material 28 as well as over the surface of material 26 within openings 30, and subsequently material 32 can be selectively removed from over surfaces of material 28 while remaining within openings 30. Such selective removal can be accomplished by, for example, chemical-mechanical polishing, and/or by forming a photoresist mask (not shown) over the material 32 within openings 30, while leaving other portions of material 32 exposed, and subsequently removing such other portions to leave only the segments of material 32 within openings 30. The photoresist mask can then be removed.

Oxygen 34 is ion implanted through layers 26 and 28, and into layer 16 to oxidize the material of layer 16. For instance, if layer 16 consists of silicon, the oxygen can convert the silicon to silicon dioxide. Such swells the material of layer 16, and accordingly fills the nanovoids that had been formed earlier. The oxygen preferably only partially oxidizes layer 16, with the oxidation being sufficient to fill all, or at least substantially all, of the nanovoids; but leaving at least some of the seed crystals within layer 16 that had been formed with the laser irradiation discussed previously. In some aspects, the oxidation can convert a lower portion of material 16 to silicon dioxide while leaving an upper portion of material 16 as non-oxidized silicon.

The oxygen ion utilized as implant 34 can comprise, for example, oxygen ($O_2$) or ozone ($O_3$). The oxygen ion implant can occur before or after formation of openings 30 and provision of metal-containing layer 32.

Construction 10 is exposed to continuous wave laser irradiation while being held at an appropriate temperature (which can be, for example, from about 300° C. to about 450° C.; or in particular applications can be greater than or equal to 550° C.) to cause transformation of at least some of layer 26 to a crystalline form. The exposure to the laser irradiation comprises exposing the material of construction 10 to laser-emitted electromagnetic radiation scanned along a shown axis 36. Preferably, the axis 36 along which the laser irradiation is scanned is the same axis that was utilized for scanning of laser irradiation in the processing stage of FIG. 2.

The crystallization of material 26 (which can also be referred to as a recrystallization of the material) is induced utilizing metal-containing layer 32, and accordingly corresponds to an application of MILC. The MILC transforms material 26 to a crystalline form and the seed layer provides the crystallographic orientation while undergoing partial oxidation.

The crystal orientation within crystallized layer 26 can originate from the crystals initially formed in islands 18. Accordingly, crystal orientations formed within layer 26 can be controlled through control of the crystal orientations formed within the semiconductive material 16 of islands 18.

The oxidation of part of material 16 which was described previously can occur simultaneously with the MILC arising from continuous wave laser irradiation. Partial oxidation of seed layer 16 facilitates: (1) Ge enrichment into Si—Ge layer 26 (which improves carrier mobility); (2) stress-relief of Si—Ge layer 26; and (3) enhancement of recrystallization of Si—Ge layer 26. The crystallization of material 26 can be followed by an anneal of material 26 at a temperature of, for example, about 900° C. for a time of about 30 minutes, or by an appropriate rapid thermal anneal, to further ensure relaxed, defect-free crystallization of material 26.

Figure 5:
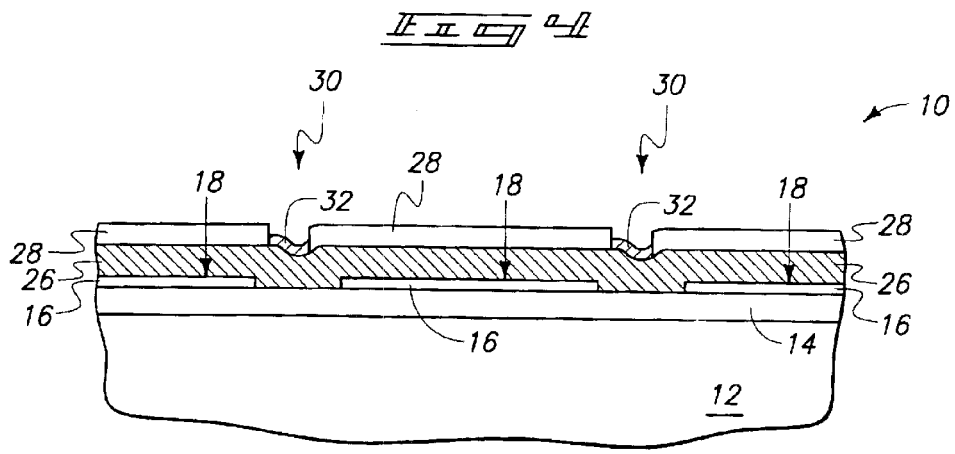
FIG. 5 is a view of the FIG. 1 fragment shown at a processing stage subsequent to that of FIG. 4.

FIG. 5 shows construction 10 after the processing described above with reference to FIG. 4. Specifically, the voids that had been in material 16 are absent due to the oxidation of material 16. Also, semiconductive material 26 has been transformed into a crystalline material (illustrated diagrammatically by the cross-hatching of material 26 in FIG. 5). Crystalline material 26 can consist of a single large crystal, and accordingly can be monocrystalline. Alternatively, crystalline material 26 can be polycrystalline. If crystalline material 26 is polycrystalline, the crystals of the material will preferably be equal in size or larger than the blocks 18. In particular aspects, each crystal of the polycrystalline material can be about as large as one of the shown islands 18. Accordingly, the islands can be associated in a one-to-one correspondence with crystals of the polycrystalline material.

As the shown metal layers 32 are effectively in a one-to-one relationship with islands 18, the one-to-one correspondence of crystals to islands can occur during the MILC. Specifically, single crystals can be generated relative to each of islands 18 during the MILC process described with reference to FIG. 4. It is also noted, however, that although the metal layers 32 are shown in a one-to-one relationship with the islands in the cross-sectional views of FIGS. 4 and 5, the construction 10 comprising the shown fragment should be understood to extend three dimensionally. Accordingly, the islands 18 and metal layers 32 can extend in directions corresponding to locations into and out of the page relative to the shown cross-sectional view. There can be regions of the construction which are not shown where a metal layer overlaps with additional islands besides the shown islands.

Figure 6:
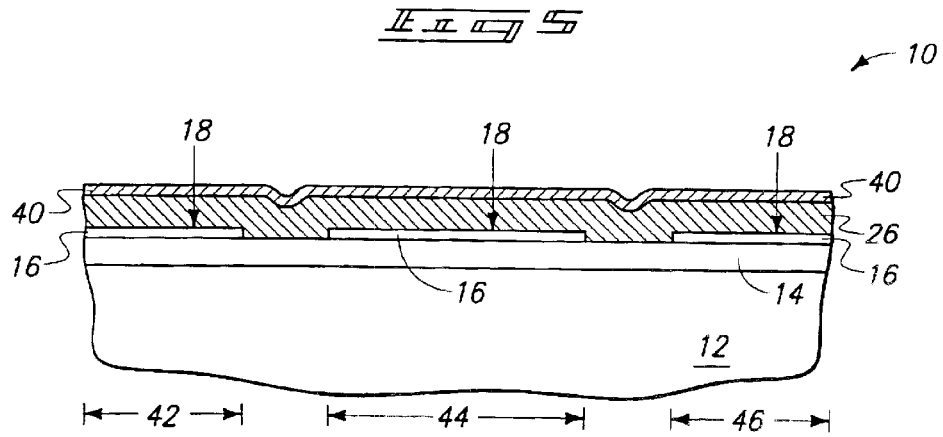
FIG. 6 is a view of the FIG. 1 fragment shown at a processing stage subsequent to that of FIG. 5.

Referring to FIG. 6, layers 28 and 32 (FIG. 5) are removed, and subsequently a layer 40 of crystalline semiconductive material is formed over layer 26. In typical applications, layer 26 will have a relaxed crystalline lattice and layer 40 will have a strained crystalline lattice. As discussed previously, layer 26 will typically comprise both silicon and germanium, with the germanium being present to a concentration of from about 10 atomic percent to about 60 atomic percent. Layer 40 can comprise, consist essentially of, or consist of either doped or undoped silicon; or alternatively can comprise, consist essentially of, or consist of either doped or undoped silicon/germanium. If layer 40 comprises silicon/germanium, the germanium content can be from about 10 atomic percent to about 60 atomic percent.

Strained lattice layer 40 can be formed by utilizing methods similar to those described in, for example, Huang, L. J. et al., "Carrier Mobility Enhancement in Strained Si-on-Insulator Fabricated by Wafer Bonding", VLSI Tech. Digest, 2001, pp. 57–58; and Cheng, Z. et al., "SiGe-On-Insulator (SGOI) Substrate Preparation and MOSFET Fabrication for Electron Mobility Evaluation" 2001 IEEE SOI Conference Digest, October. 2001, pp. 13–14.

Strained lattice layer 40 can be large polycrystalline or monocrystalline. If strained lattice layer 40 is polycrystalline, the crystals of layer 40 can be large and in a one-to-one relationship with the large crystals of a polycrystalline relaxed crystalline layer 26. Strained lattice layer 40 is preferably monocrystalline over the individual blocks 18.

The strained crystalline lattice of layer 40 can improve mobility of carriers relative to the material 26 having a relaxed crystalline lattice. However, it is to be understood that layer 40 is optional in various aspects of the invention.

Each of islands 18 can be considered to be associated with a separate active region 42, 44 and 46. The active regions can be separated from one another by insulative material subsequently formed through layers 26 and 40 (not shown). For instance, a trenched isolation region can be formed through layers 26 and 40 by initially forming a trench extending through layers 26 and 40 to insulative material 14, and subsequently filling the trench with an appropriate insulative material such as, for example, silicon dioxide.

As discussed previously, crystalline material 26 can be a single crystal extending across an entirety of the construction 10 comprising the shown fragment, and accordingly extending across all of the shown active regions. Alternatively, crystalline material 26 can be polycrystalline. If crystalline material 26 is polycrystalline, the single crystals of the polycrystalline material will preferably be large enough so that only one single crystal extends across a given active region. In other words, active region 42 will preferably comprise a single crystal of material 26, active region 44 will comprise a single crystal of the material, and active region 46 will comprise a single crystal of the material, with the single crystals being separate and discrete relative to one another.

FIG. 7 shows an expanded view of active region 44 at a processing stage subsequent to that of FIG. 6, and specifically shows a transistor device 50 associated with active region 44 and supported by crystalline material 26.

Transistor device 50 comprises a dielectric material 52 formed over strained lattice 40, and a gate 54 formed over dielectric material 52. Dielectric material 52 typically comprises silicon dioxide, and gate 54 typically comprises a stack including an appropriate conductive material, such as, for example, conductively-doped silicon and/or metal.

A channel region 56 is beneath gate 54, and in the shown construction extends across strained crystalline lattice material 40. The channel region may also extend into relaxed crystalline lattice material 26 (as shown). Channel region 56 is doped with a p-type dopant.

Transistor construction 50 additionally comprises source/drain regions 58 which are separated from one another by channel region 56, and which are doped with n-type dopant to an n$^+$ concentration (typically, a concentration of at least $10^{21}$ atoms/cm$^3$). In the shown construction, source/drain regions 58 extend across strained lattice layer 40 and into relaxed lattice material 26. Although source/drain regions 58 are shown extending only partially through relaxed lattice layer 26, it is to be understood that the invention encompasses other embodiments (not shown) in which the source/drain regions extend all the way through relaxed material 26 and to material 16.

Channel region 56 and source/drain regions 58 can be formed by implanting the appropriate dopants into crystalline materials 26 and 40. The dopants can be activated by rapid thermal activation (RTA), which can aid in keeping the thermal budget low for fabrication of field effect transistor 50.

An active region of transistor device 50 extends across source/drain regions 58 and channel region 56. Preferably the portion of the active region within crystalline material 26 is associated with only one single crystal of material 26. Such can be accomplished by having material 26 be entirely monocrystalline. Alternatively, material 26 can be polycrystalline and comprise an individual single grain which accommodates the entire portion of the active region that is within material 26. The portion of strained lattice material 40 that is encompassed by the active region is preferably a single crystal, and can, in particular aspects, be considered an extension of the single crystal of the relaxed lattice material 26 of the active region.

Crystalline materials 40 and 26 can, together with any crystalline structures remaining in material 16, have a total thickness of less than or equal to about 2000 Å. Accordingly the crystalline material can correspond to a thin film formed over an insulative material. The insulative material can be considered to be insulative layer 14 alone, or a combination of insulative layer 14 and oxidized portions of material 16.

The transistor structure 50 of FIG. 7 corresponds to an n-type field effect transistor (NFET), and in such construction it can be advantageous to have strained crystalline material 40 consist of a strained silicon material having appropriate dopants therein. The strained silicon material can improve mobility of electrons through channel region 56, which can improve performance of the NFET device relative to a device lacking the strained silicon lattice. Although it can be preferred that strained lattice material 40 comprise silicon in an NFET device, it is to be understood that the strained lattice can also comprise other semiconductive materials. A strained silicon lattice can be formed by various methods. For instance, strained silicon could be developed by various means and lattice 40 could be created by lattice mismatch with other materials or by geometric conformal lattice straining on another substrate (mechanical stress). Strained lattice 40 can comprise other materials alternatively to, or additionally to, silicon, and can, for example, comprise a combination of silicon and germanium. There can be advantages to utilizing the strained crystalline lattice comprising silicon and germanium relative to structures lacking any strained lattice. However, it is generally most preferable if the strained lattice consists of silicon alone (or doped silicon), rather than a combination of silicon and germanium.

A pair of sidewall spacers 60 are shown formed along sidewalls of gate 54, and an insulative mass 62 is shown extending over gate 54 and material 40. Conductive interconnects 63 and 64 extend through the insulative mass 62 to electrically connect with source/drain regions 58. Interconnects 63 and 64 can be utilized for electrically connecting transistor construction 50 with other circuitry external to transistor construction 50. Such other circuitry can include, for example, a bitline and a capacitor in applications in which construction 50 is incorporated into dynamic random access memory (DRAM).

FIG. 8 shows construction 10 at a processing stage subsequent to that of FIG. 7, and shows a capacitor structure 100 formed over and in electrical contact with conductive interconnect 64. The shown capacitor structure extends across gate 54 and interconnect 63.

Capacitor construction 100 comprises a first capacitor electrode 102, a second capacitor electrode 104, and a dielectric material 106 between capacitor electrodes 102 and 104. Capacitor electrodes 102 and 104 can comprise any appropriate conductive material, including, for example, conductively-doped silicon. In particular aspects, electrodes 102 and 104 will each comprise n-type doped silicon, such as, for example, polycrystalline silicon doped to a concentration of at least about $10^{21}$ atoms/cm$^3$ with n-type dopant. In a particular aspect of the invention, electrode 102, conductive interconnect 64 and the source/drain region 58 electrically connected with interconnect 64 comprise, or consist of, n-type doped semiconductive material. Accordingly, n-type doped semiconductive material extends from the source/drain region, through the interconnect, and through the capacitor electrode.

Dielectric material 106 can comprise any suitable material, or combination of materials. Exemplary materials suitable for dielectric 106 are high dielectric constant materials including, for example, silicon nitride, aluminum oxide, $TiO_2$, $Ta_2O_5$, $ZrO_2$, etc.

The conductive interconnect 63 is in electrical connection with a bitline 108. Top capacitor electrode 104 is shown in electrical connection with an interconnect 110, which in turn connects with a reference voltage 112, which can, in particular aspects, be ground. The construction of FIG. 8 can be considered a DRAM cell, and such can be incorporated into a computer system as a memory device.

Figure 9:
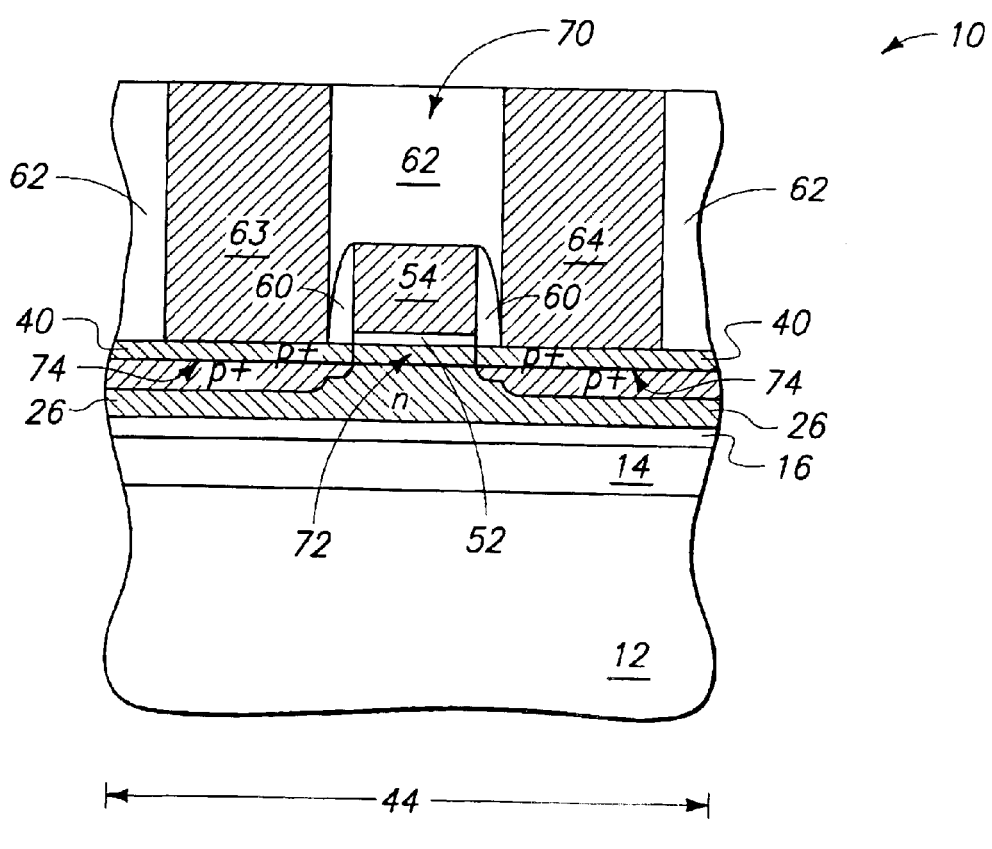
FIG. 9 is a view of an expanded region of FIG. 6 shown at a processing stage subsequent to that of FIG. 6 in accordance with an alternative embodiment relative to that of FIG. 7.

FIG. 9 shows construction 10 at a processing stage subsequent to that of FIG. 6 and alternative to that described previously with reference to FIG. 7. In referring to FIG. 9, similar numbering will be used as is used above In describing FIG. 7, where appropriate.

A transistor construction 70 is shown in FIG. 9, and such construction differs from the construction 50 described above with reference to FIG. 7 in that construction 70 is a p-type field effect transistor (PFET) rather than the NFET of FIG. 7. Transistor device 70 comprises an n-type doped channel region 72 and p$^+$-doped source/drain regions 74. In other words, the channel region and source/drain regions of transistor device 70 are oppositely doped relative to the channel region and source/drain regions described above with reference to the NFET device 50 of FIG. 7.

The strained crystalline lattice material 40 of the PFET transistor device 70 can consist of appropriately doped silicon, or consist of appropriately doped silicon/germanium. It can be most advantageous if the strained crystalline lattice material 40 comprises appropriately doped silicon/germanium in a PFET construction, in that silicon/germanium can be a more effective carrier of holes with higher mobility than is silicon without germanium.

FIG. 10 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, the DRAM unit cell described with reference to FIG. 8. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 11. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMS) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A process of forming a semiconductor-on-insulator construction, comprising:

forming a first layer over a substrate, the first layer being electrically insulative;

forming a plurality of discrete islands of material over the first layer;

forming crystals in the material of the discrete islands;

forming a second layer over the discrete islands, the second layer comprising silicon and germanium;

forming metal in physical contact with the second layer; and utilizing the metal for metal-induced-lateral-recrystallization of the second layer, the metal-induced-lateral-recrystallization converting the second layer to a crystalline material.

2. The method of claim 1 wherein the crystalline material consists of a single crystal.

3. The method of claim 1 wherein the crystalline material is polycrystalline.

4. The method of claim 1 further comprising removing the metal from over the crystalline material.

5. The method of claim 1 wherein the substrate comprises one or more of glass, semiconductive material, metal, plastic, $SiO_2$ and $Al_2O_3$.

6. The method of claim 1 wherein the first layer consists of silicon dioxide.

7. The method of claim 1 wherein the material of the discrete islands consists of silicon or doped silicon.

8. The method of claim 1 wherein the material of the discrete islands consists of doped silicon in which the dopant concentration is from about $10^{14}$ atoms/cm$^3$ to about $10^{20}$ atoms/cm$^3$.

9. The method of claim 1 wherein the discrete islands have a thickness of from about 5 nanometers to about 10 nanometers.

10. The method of claim 1 wherein the second layer consists of silicon and germanium.

11. The method of claim 1 wherein the second layer consists of silicon, germanium and one or more dopants.

12. The method of claim 1 wherein the second layer has a thickness of from about 50 nanometers to about 100 nanometers.

13. The method of claim 1 wherein the metal comprises nickel.

14. The method of claim 1 wherein the forming the crystals in the material of the discrete islands comprises implanting helium into said material to form voids and subsequently exposing said material to laser-emitted electromagnetic radiation to form the crystals.

15. The method of claim 14 further comprising forming a cap over the discrete islands prior to implanting the helium, and removing the cap prior to forming the second layer.

16. The method of claim 15 wherein the cap comprises silicon dioxide.

17. The method of claim 1 further comprising converting at least a portion of one or more of the islands to silicon dioxide after forming the second layer and prior to the metal-induced-lateral-recrystallization.

18. The method of claim 17 wherein the converting comprises implanting O$_2$ into said one or more of the islands.

19. The method of claim 1 further comprising:
forming a third layer over the second layer;
removing portions of the third layer to form openings extending through the third layer to the second layer; and
forming the metal within the openings.

20. The method of claim 19 wherein the third layer comprises silicon dioxide.

21. A process of forming a transistor associated with a semiconductor-on-insulator construction, comprising:
forming a first layer over a substrate, the first layer being electrically insulative;
forming a plurality of discrete islands of material over the first layer;
exposing the material of the discrete islands to helium and laser-emitted electromagnetic radiation;
forming a second layer over the discrete islands, the second layer comprising silicon and germanium;
forming metal in physical contact with the second layer and utilizing the metal for metal-induced-lateral-recrystallization of the second layer, the metal-induced-lateral-recrystallization converting the second layer to a crystalline material;
forming a transistor gate over the crystalline material; and
forming a pair of source/drain regions gatedly connected to one another by the gate and extending into the crystalline material.

22. The method of claim 21 wherein the forming the source/drain regions comprises implanting dopant into the crystalline material.

23. The method of claim 21 wherein the crystalline material has a relaxed crystalline lattice, and further comprising:
forming a strained crystalline lattice over the relaxed crystalline lattice; and
forming the transistor gate over the strained crystalline lattice.

24. The method of claim 23 wherein the strained crystalline lattice and relaxed crystalline lattice together define a crystalline mass having a thickness of less than or equal to 2000 Å.

25. The method of claim 23 wherein the strained crystalline lattice includes silicon.

26. The method of claim 23 wherein the strained crystalline lattice includes silicon and germanium.

27. The method of claim 21 wherein the transistor gate and source/drain regions are comprised by an NFET device.

28. The method of claim 21 wherein the transistor gate and source/drain regions are comprised by a PFET device.

29. The method of claim 21 wherein the transistor gate and source/drain regions are associated with an active region which extends into the crystalline material, and wherein an entirety of the active region within the crystalline material is within only a single crystal of the crystalline material.

* * * * *

UNITED STATES PATENT AND TRADEMARK OFFICE
CERTIFICATE OF CORRECTION

PATENT NO. : 6,908,798 B1
APPLICATION NO. : 10/625068
DATED : June 21, 2005
INVENTOR(S) : Arup Bhattacharyya It is certified that error appears in the above-identified patent and that said Letters Patent is hereby corrected as shown below:

Title Page #56
In the References Cited:

Col. 2, line 14 -
  Replace "Kim, C.H. et al., "A New High -Performace Poly3-Si TFT"
  With --Kim, C.H. et al, "A New High -Performance Poly-Si TFT--

In the Specification:

Col. 2, line 44 -
  Replace ""High Performance Sub -100 nm Si TFT by Pattem-"
  With -- "High Performance Sub- 100 nm Si TFT by Pattern---

Col. 2, line 54 -
  Replace "islands for device channel regions.  Nickelinduced-lateral"
  With --islands for device channel regions.  Nickel-induced-lateral---

Col. 3, line 22 -
  Replace "Digest, 2002, 00. 98-99; and Huang, L. J. et al.,"
  With --Digest, 2002, pp. 98-99; and Huang, L. J. et al.,--

Col. 4, line 20 -
  Replace "FIG. 2 is a view of the FIG. 1 wafer shown at a processing"
  With --FIG. 2 is a view of the FIG. 1 fragment shown at a processing--

UNITED STATES PATENT AND TRADEMARK OFFICE
CERTIFICATE OF CORRECTION

| | |
|---|---|
| PATENT NO. | : 6,908,798 B1 |
| APPLICATION NO. | : 10/625068 |
| DATED | : June 21, 2005 |
| INVENTOR(S) | : Arup Bhattacharyya |

It is certified that error appears in the above-identified patent and that said Letters Patent is hereby corrected as shown below:

Col. 10, line 66 -
  Replace "similar numbering will be used as in used above In"
  With --similar numbering will be used as is used above in--

Signed and Sealed this

Twenty-second Day of August, 2006

JON W. DUDAS
*Director of the United States Patent and Trademark Office*